(12) United States Patent
Lee et al.

(10) Patent No.: US 7,771,778 B2
(45) Date of Patent: Aug. 10, 2010

(54) FABRICATING METHOD OF PLASTIC SUBSTRATE

(75) Inventors: Kyoung Mook Lee, Seoul (KR); Sung Hwan Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 902 days.

(21) Appl. No.: 11/641,720

(22) Filed: Dec. 20, 2006

(65) Prior Publication Data

US 2008/0038459 A1 Feb. 14, 2008

(30) Foreign Application Priority Data

May 12, 2006 (KR) ...................... 10-2006-0042892

(51) Int. Cl.
*B05D 3/02* (2006.01)
(52) U.S. Cl. .................... 427/96.1; 427/412.1
(58) Field of Classification Search ........................ None
See application file for complete search history.

(56) References Cited

U.S. PATENT DOCUMENTS 7,265,003 B2 * 9/2007 Hoffman et al. ............ 438/149
2005/0095356 A1 * 5/2005 Nakamura et al. ............ 427/58
2006/0145149 A1 * 7/2006 Halik et al. ................... 257/40

OTHER PUBLICATIONS

Halik et al, Advanced Materials, 14(23), pp. 1717-1721, 2002.*

* cited by examiner

*Primary Examiner*—Erma Cameron
(74) *Attorney, Agent, or Firm*—McKenna Long & Aldridge LLP

(57) ABSTRACT

This invention relates to a fabricating method of a plastic substrate adapted to improve the stability of a display device fabrication process. The fabrication process utilizes the plastic substrate, which is inexpensive and easy to obtain. A fabricating method according to an embodiment of the present invention includes providing a plastic substrate; spreading an organic film on the plastic substrate; and applying heat to the plastic substrate over which the organic film is spread to conduct heat to the plastic substrate and to harden the organic film at the same time.

18 Claims, 8 Drawing Sheets

ORGANIC FILM COATING PROCESS(SS1)

HEAT TREATMENT PROCESS(SS2)

ARRAY PROCESS(SS3)

FABRICATING METHOD OF PLASTIC SUBSTRATE

This application claims the benefit of Korean Patent Application No. P06-0042892 filed on May 12, 2006, which is hereby incorporated by reference for all purposes as if fully set forth herein.

BACKGROUND OF THE INVENTION

1. Field of the Invention

The present invention relates to a substrate for a display device. More particularly, the present invention relates to a fabricating method of a plastic substrate adapted to improve the stability of a display device fabrication process. The fabrication process utilizes the plastic substrate, which is inexpensive and easy to obtain.

2. Description of the Related Art

Recently, the display device market has focused its attention on flat panel display devices because these devices are easily manufactured to be thin, light and large-sized.

Flat panel display devices include, for example, liquid crystal display (LCD) devices, plasma display panels (PDP), and organic electro luminescence displays (OLED). These flat panel display devices include glass substrates. However, because glass substrates are not flexible, there is a limit in the application and use of flat panel display devices.

Accordingly, a flexible display device has been introduced as the next generation display device. The flexible display device includes a substrate of a flexible material such as plastic instead of the related art inflexible glass substrate.

Ordinarily, the plastic used for the flexible substrate is generally made of polyethersulfone (PES). This material is generally employed as the substrate for the display device because it has a high glass transition temperature (Tg).

The glass transition temperature is the transition temperature at which a polymer material changes from a glass state to a flexible rubbery state. Polymer materials, such as plastic, in their glass state, are more flexible than glass. Accordingly, polymer materials are more flexible than glass. Around the Tg, polymer materials, such as plastic, are much more flexible than when they are in their glass state. At room temperature, both polymer materials and glass are in their respective glass state, i.e. amorphous state. However, at room temperature, polymer materials in their glass state are more flexible than glass in its glass state. Accordingly, glass is harder than polymer materials at room temperature. Flexible flat panel display devices use polymer materials because they are more flexible than glass at room temperature.

Generally, display device fabrication processes are carried out at a maximum temperature of 200° C. PES has a glass transition temperature of 220° C. Because PES has a glass transition temperature higher than the processing temperature, PES is more stable against heat than other plastics that have a glass transition temperature below 200° C. The PES substrate may be prepared by the fabrication steps as shown in FIG. 1, so that it can be used in the flexible flat panel display.

Referring to FIG. 1, during the fabrication process of the display device, the surface of the PES substrate is first heat-treated as shown in step S1. This reduces future deformation that may be caused by heat generated in the array process of step S3.

In the heat treatment process of step S1, the PES substrate is deformed by heat. As shown in FIG. 2, the degree of deformity is lessened when the PES substrate is heat-treated at a temperature of 180° C. or 200° C. for more than 48 hours. The PES substrate that went through the heat treatment process (S1) has been deformed by heat. Therefore, the amount of deformation that will be caused by heat generated in the array process (S3) of the display device is not so large. Accordingly, it is possible to properly form wire lines on the PES substrate because deformation caused in the array process (S3) is lessened.

After the heat treatment process (S1), an inorganic material, such as SiNx, is coated on the PES substrate to form a barrier layer by a barrier forming process (S2). The barrier layer prevents an etching gas or a chemical material, such as an etchant or a stripper, used in the array process (S3) from penetrating the PES substrate to deform the PES substrate.

Each wire line of the display device may be formed by the array process (S3) on the PES substrate after the above mentioned barrier layer is formed.

However, utilizing PES as the material for the flexible substrate becomes very expensive, thereby increasing manufacturing costs of the display device. That is, the PES substrate is an expensive plastic material.

On the other hand, a plastic such as polyethylene naphthalate (PEN) is relatively inexpensive and easy to fabricate. However, PEN tends to have a characteristic directivity of the fabrication process. That is, a plastic substrate made of PEN has a tendency to change in one-direction in which heat is applied to the substrate.

Thus, it is difficult to properly form a wire line in the array process because a PEN plastic substrate is non-uniform and deformed by heat generated during the process that causes the above mentioned directivity. That is, an inexpensive plastic, such as PEN, obtains a non-uniform surface roughness during an initial heat process. This causes difficulty in correctly forming a wire line in the subsequent array process. As a result, it is difficult to carry out a stable array process on plastics substrates made of materials other than PES. That is, it is difficult to carry out a stable array process on a plastic substrate, such as PEN, which is inexpensive and easy to fabricate.

SUMMARY OF THE INVENTION

Accordingly, the present invention is directed to a fabricating method of a plastic substrate that substantially obviates one or more of the problems due to limitations and disadvantages of the related art.

An advantage of the present invention is to provide a fabricating method of a plastic substrate adapted to improve the stability of a display device fabrication process. The fabrication process utilizes the plastic substrate, which is inexpensive and easy to obtain.

Additional features and advantages of the invention will be set forth in the description which follows, and in part will be apparent from the description, or may be learned by practice of the invention. These and other advantages of the invention will be realized and attained by the method particularly pointed out in the written description and claims hereof as well as the appended drawings.

To achieve these and other advantages and in accordance with the purpose of the present invention, as embodied and broadly described, a fabricating method includes providing a plastic substrate; spreading an organic film on the plastic substrate; and applying heat to the plastic substrate over which the organic film is spread to conduct heat to the plastic substrate and to harden the organic film at the same time.

In another aspect of the present invention, a fabricating method includes providing a deformed plastic substrate having heat directivity; spreading an organic film on the plastic substrate; and applying heat to the plastic substrate over which the organic film is spread to conduct heat to the plastic substrate and to harden the organic film at the same time.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the embodiments of the present invention, examples of which are illustrated in the accompanying drawings.

Figure 1:
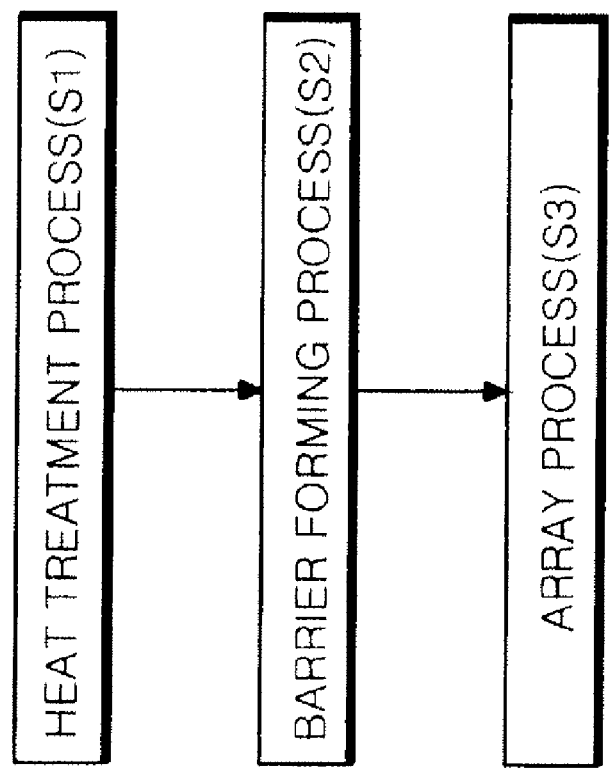
FIG. 1 is a flow chart representing a fabricating method of a TFT array substrate using a flexible plastic substrate for a display device of the related art.
Figure 2:
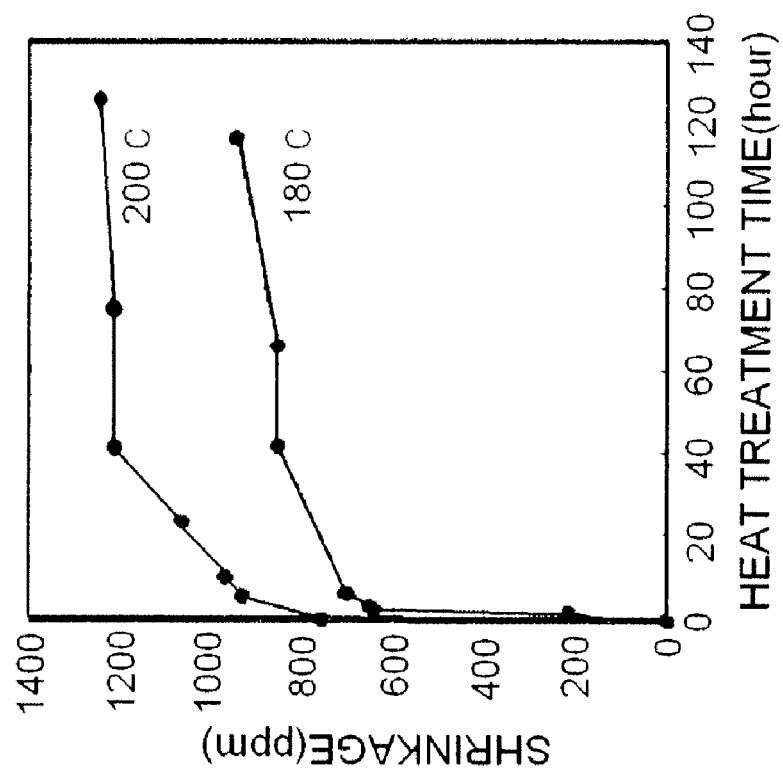
FIG. 2 is a graph representing the deformation (shrinkage) of a PES substrate for a heat treatment temperature and a heat treatment time in a heat treatment process of the related art.
Figure 3:
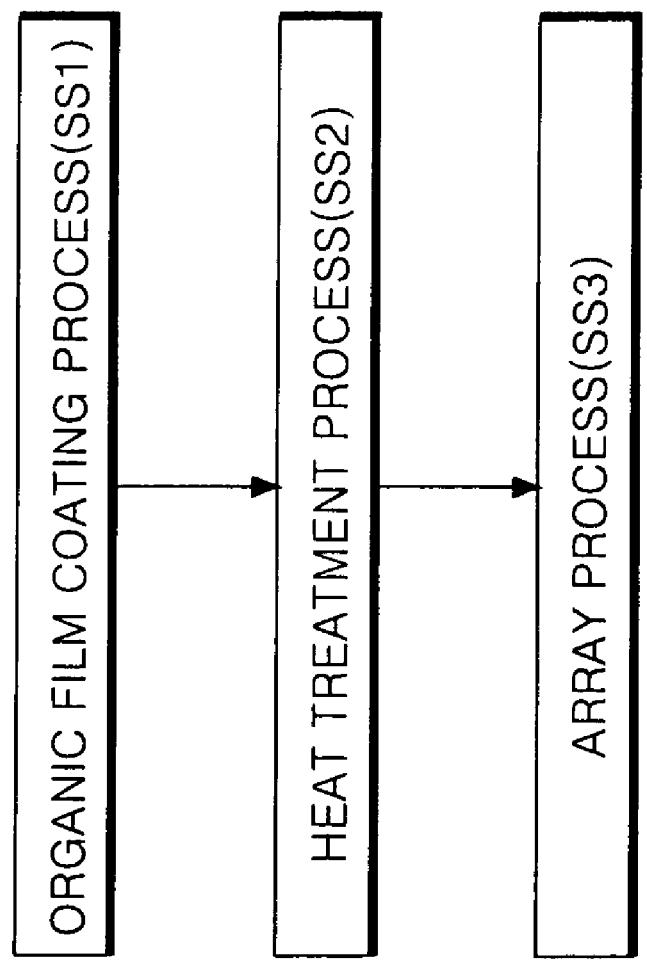
FIG. 3 is a flow chart representing a fabricating method of a TFT array substrate using a flexible plastic substrate for a display device according to the present invention.

FIG. 3 is a diagram for explaining a fabricating method of a TFT array substrate using a flexible plastic substrate according to an embodiment of the present invention.

In an embodiment of the present invention, low cost plastic materials that have been deformed with directivity using a heat treatment are employed. That is, low cost plastic materials that have been deformed in one-direction in which heat is applied are utilized. These materials include, for example, polyethylene naphthalate (PEN), polyethylene terephthalate (PET) and polycarbonate (PC). These materials are advantageous in that they are inexpensive and easy to manufacture.

The plastic materials according to the above-mentioned embodiment of the present invention have a non-uniform surface, thus the surface should be made even so as for wire lines of a display device to be uniformly formed.

Referring to FIG. 3, in order to level the surface of the plastic substrate for the display device according to the present invention, an organic film is coated on the plastic substrate by a deposition method, such as spin coating, as shown in step SS1.

It is less expensive to form an organic film coating rather than an inorganic film coating. This is because the organic film coating is made by a method such as spin coating. However, the inorganic film coating is made by a method such as chemical vapor deposition (CVD). The deposition equipment used for spin coating is less expensive than the deposition equipment used in a CVD method.

The organic film material used in the organic film coating may be, for example, BCB (benzocyclobutene), acrylic resin, epoxy resin, PVP (polyvinyl phenol) or PVA (polyvinyl alcohol).

The organic film coating evens the surface of the plastic and also acts as a barrier. The organic film barrier prevents an etching gas or a chemical material, such as an etchant or a stripper, used in the array process from penetrating the plastic substrate to deform the plastic substrate. However, a material including the hydroxyl radical —OH should not be used in the organic film coating. The hydroxyl radical does not protect against moisture. Thus, an organic material including the hydroxyl radical cannot properly function as a barrier because it cannot prevent the penetration of chemicals including moisture. Also, the hydroxyl radical prevents gas generated during the heat treatment process in step SS2 from being discharged to the outside. The heat treatment process in step SS2 is used to harden the organic film, thus, the hydroxyl radical may form a bubble within the organic film. Accordingly, a material including the hydroxyl radical should not be used to form the organic film.

As shown in FIG. 3, the organic material is dissolved in an organic solvent in the organic film coating process (SS1). The resulting mixture is fluid. The organic solvent is then evaporated from the organic material to be hardened by a heat treatment process (SS2). Therefore, the heat treatment process (SS2) not only hardens the organic material, but also provides uniformity to the plastic substrate according to the present invention. The heat treatment process may be performed at a proper temperature for a fixed time. An array process is performed in step SS3.

Figure 4:
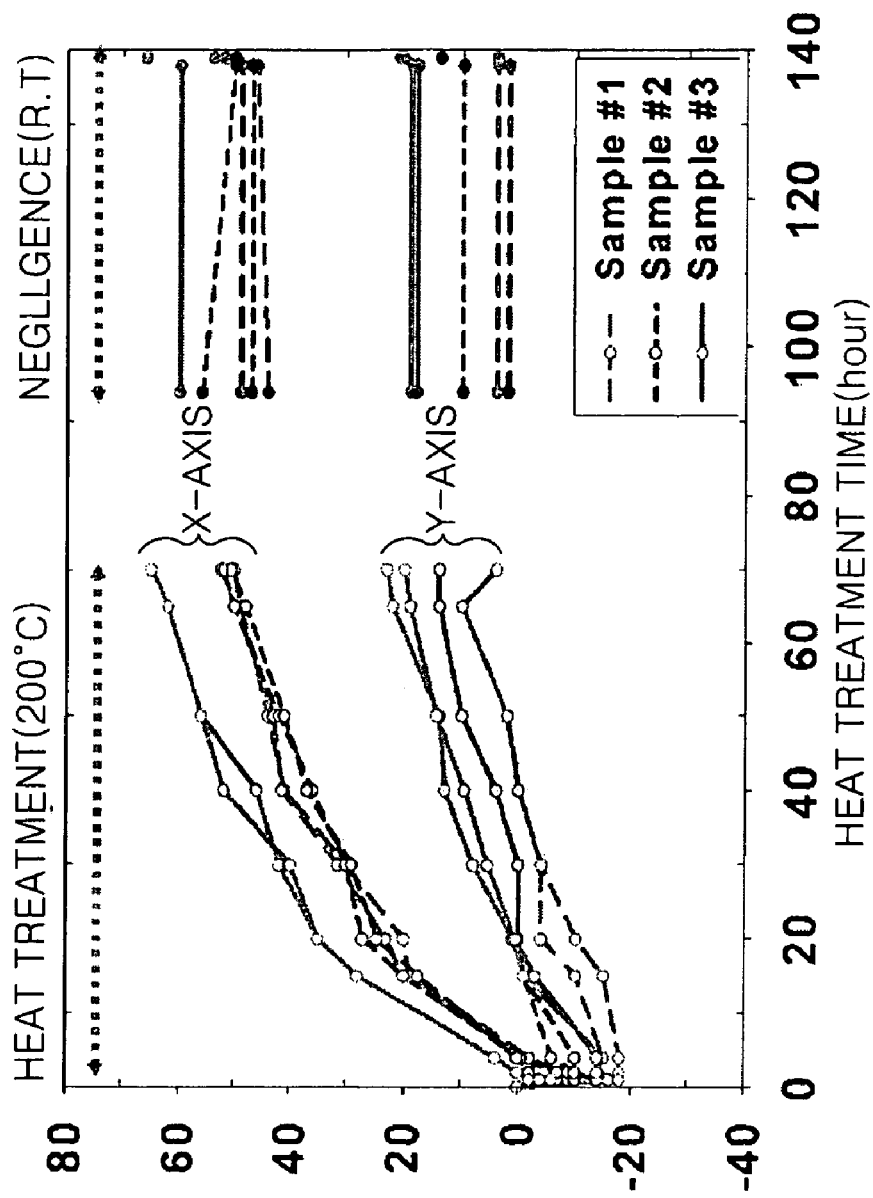
FIG. 4 is a graph representing the deformation of a plastic substrate for a heat treatment temperature and a heat treatment time when an organic film is not coated over the plastic substrate in a heat treatment process of the plastic substrate according to the present invention.

FIG. 4 is a graph representing a change of length in accordance with a change of time when heat is applied to a PEN substrate at a temperature of 200° C. At the start of the heat treatment, lengths of an x-axis direction of the PEN substrate and a y-axis direction perpendicular to the x-axis are each 4 cm. The x-axis is an axis having directivity, i.e., an axis of which the degree of change is largest, and the y-axis is perpendicular to the x-axis.

Referring to FIG. 4, the PEN substrate has directivity because the changing in length in the x-axis direction is greater than the changing in length in the y-axis direction during the heating process. However, the difference between the changing in length in the x-axis direction and the changing in length in the y-axis direction is decreased when the PEN substrate is heat-treated at the temperature of 200° C. for 20 hours or more.

TABLE 1 represents a length changed when heat-treated for less than 20 hours for each sample shown in FIG. 4, a length changed when heat-treated for not less than 20 hours, and an average of the changed lengths of samples in accordance with time.

TABLE 1

| Change of substrate in accordance with time (T) | | Sample 1 | | Sample 2 | | Sample 3 | | Average | |
|---|---|---|---|---|---|---|---|---|---|
| | | T < 20 | 20 ≦ T ≦ 70 | T < 20 | 20 ≦ T ≦ 70 | T < 20 | 20 ≦ T ≦ 70 | T < 20 | 20 ≦ T ≦ 70 |
| Without organic film | x-axis (μm) | 1.92 | 0.60 | 1.71 | 0.54 | 2.18 | 0.60 | 1.94 | 0.58 |
| | y-axis (μm) | 0.58 | 0.40 | 0.58 | 0.38 | 1.20 | 0.44 | 0.79 | 0.41 |

(Time unit: Hour, Length Change unit: μm)

Referring to TABLE 1, when the samples are heat-treated at 200° C. for less than 20 hours, a ratio of an x-axis average change in length of the samples 1 to 3 and a y-axis average change in length of the samples 1 to 3 is 2.46:1 (1.94:0.79). When the samples are heat-treated at 200° C. for 20 hours or more, a ratio of the x-axis average change in length of the samples 1 to 3 and the y-axis average change in length of the samples 1 to 3 is 1.63:1 (0.58:0.41). This ratio is lower than when the samples are heat-treated for less than 20 hours. That is, when the PEN plastic substrate is heat-treated at 200° C. for 20 hours or more, the difference between the changing in length in the x-axis direction and the changing in length in the y-axis direction may be reduced.

Figure 5:
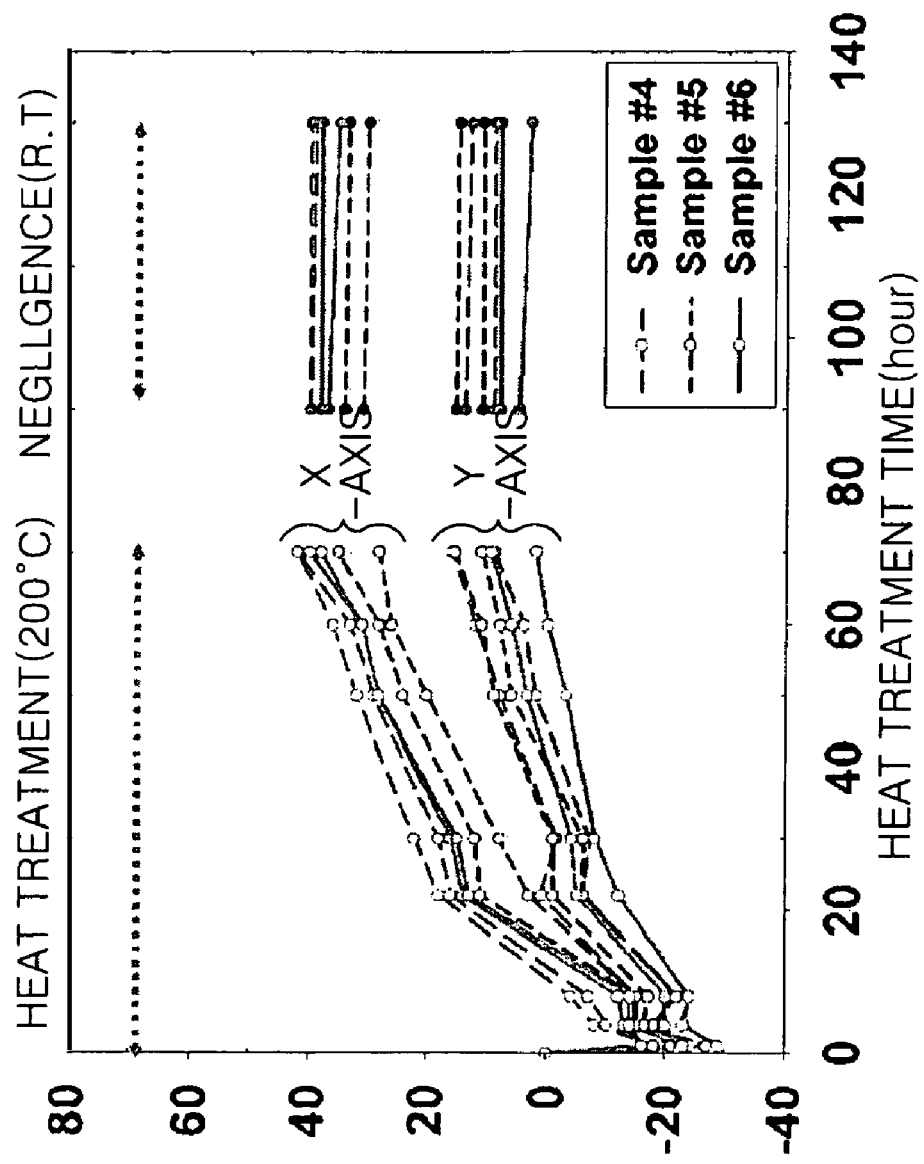
FIG. 5 is a graph representing the deformation of a plastic substrate for a heat treatment temperature and a heat treatment time when an organic film is coated over the plastic substrate in a heat treatment process of the plastic substrate according to the present invention.

FIG. 5 is a graph representing a change of length in accordance with a heat treatment time when an organic film is coated over the PEN substrate and the PEN substrate is heat-treated at the temperature of 200° C. At the start of the heat treatment, lengths of an x-axis direction of the PEN substrate and a y-axis direction perpendicular to the x-axis are each 4 cm.

Referring to FIG. 5, heat treating the PEN substrate after the organic film is coated may reduce the difference between the changing in length in the x-axis direction and the changing in length in the y-axis direction as compared to the difference when a direct heat treatment is performed on the PEN substrate not coated with the organic film, as in FIG. 4 and TABLE 1.

TABLE 2 represents a length changed when heat-treated for less than 20 hours for each sample shown in FIG. 5, a length changed when heat-treated for not less than 20 hours, and an average of the changed lengths of samples in accordance with time.

average change in length of the samples 1 to 3 and the y-axis average change in length of the samples 1 to 3, as shown in FIG. 4 and TABLE 1.

When the PEN substrate samples coated with the organic film are heat-treated at 200° C. for 20 hours or more, a ratio of the x-axis average change in length of the samples 4 to 6 and the y-axis average change in length of the samples 4 to 6 is 1.26:1 (0.53:0.42). This value is lower than 1.63:1, which is the ratio when the PEN substrate samples are heat-treated at 200° C. for 20 hours or more without the organic film. Again, the number is the ratio of the x-axis average change in length of the samples 1 to 3 and the y-axis average change in length of the samples 1 to 3, as shown in FIG. 4 and TABLE 1.

That is, heat treating the PEN substrate after the organic film is coated reduces the difference between the changing in length in the x-axis direction and the changing in length in the y-axis direction as compared to the difference when a direct heat treatment is performed on the PEN substrate not coated with the organic film.

Particularly, when the PEN substrate is coated with the organic film and is heat-treated at the temperature of 200° C. for 20 hours or more, the ratio of the change in length of the x-axis direction of the PEN substrate and the change in length of the y-axis direction is not more than 1.3:1. Accordingly, it is possible to reduce non-uniformity in the formation of a wire line and a thin film in the array process (SS3). That is, after coating the plastic substrate with the organic film according to an embodiment of the present invention and heat-treating the resulting substrate at a temperature of 200° C. for 20 hours or more, the heat directivity of the plastic substrate may be

TABLE 2

| Change of substrate in accordance with time (T) | | Sample 4 | | Sample 5 | | Sample 6 | | Average | |
|---|---|---|---|---|---|---|---|---|---|
| | | T < 20 | 20 ≦ T ≦ 70 | T < 20 | 20 ≦ T ≦ 70 | T < 20 | 20 ≦ T ≦ 70 | T < 20 | 20 ≦ T ≦ 70 |
| Organic film exists | x-axis (μm) | 1.56 | 0.46 | 1.67 | 0.58 | 2.00 | 0.56 | 1.74 | 0.53 |
| | y-axis (μm) | 1.11 | 0.43 | 0.11 | 0.43 | 1.00 | 0.40 | 0.07 | 0.42 |

(Time unit: Hour, Length Change unit: μm)

Referring to TABLE 2, when the PEN substrate samples coated with the organic film are heat-treated at 200° C. for less than 20 hours, a ratio of an x-axis average change in length of the samples 4 to 6 and a y-axis average change in length of the samples 4 to 6 is 1.41:1 (1.74:0.07). This value is lower than 2.46:1, which is the ratio when the PEN substrate samples are heat-treated at 200° C. for less than 20 hours without the organic film. Again, the number is the ratio of the x-axis removed. As a result, the plastic substrate according to an embodiment of the present invention responds uniformly to heat.

The present invention performs the heat treatment process (SS2) after the organic film coating process (SS1). Accordingly, it is possible that the plastic substrate responds uniformly to heat and the organic film becomes hardened, at the same time.

The temperature of the foregoing heat treatment process (SS2) may be within a range of below the glass transition temperature of the plastic substrate. According to experimental data, it is possible to reduce the directivity of the PEN substrate when heat-treating the PEN substrate for 20 hours or more at temperature little lower than 230° C. because the glass transition temperature of the PEN substrate is 230° C.

An array process (SS3) is carried out on the plastic substrate which is coated with the organic film after the heat treatment process (SS2), thereby forming each wire line and thin film of the display device.

Figure 6:
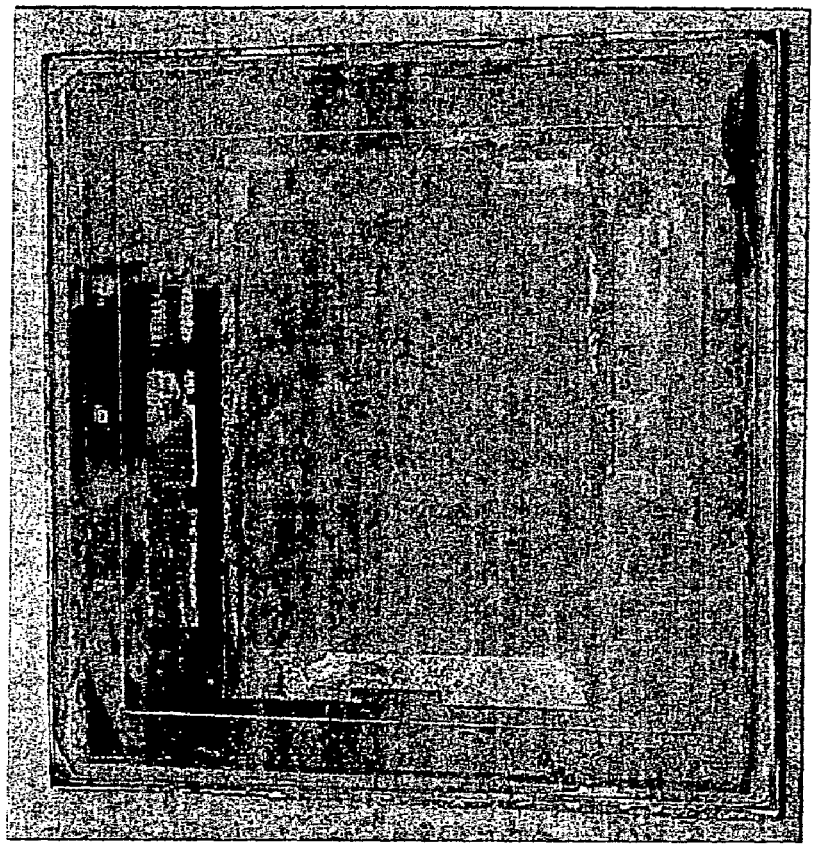
FIG. 6 is a diagram for explaining a phenomenon occurring when an organic film is not coated over the plastic substrate in the array process of the plastic substrate according to the present invention.

FIG. 6 is a diagram representing a peeling-off phenomenon which is generated when performing the array process when no organic film is formed on the plastic substrate.

If each wire line and thin film of the display device is formed by performing the array process (SS3) after the heat treatment process (SS2) on the plastic substrate not coated with the organic film, the plastic substrate is non-uniformly deformed by heat. Thus, the wire line and the thin film may not be correctly formed and may peel off, as shown in FIG. 6.

Figure 7A:
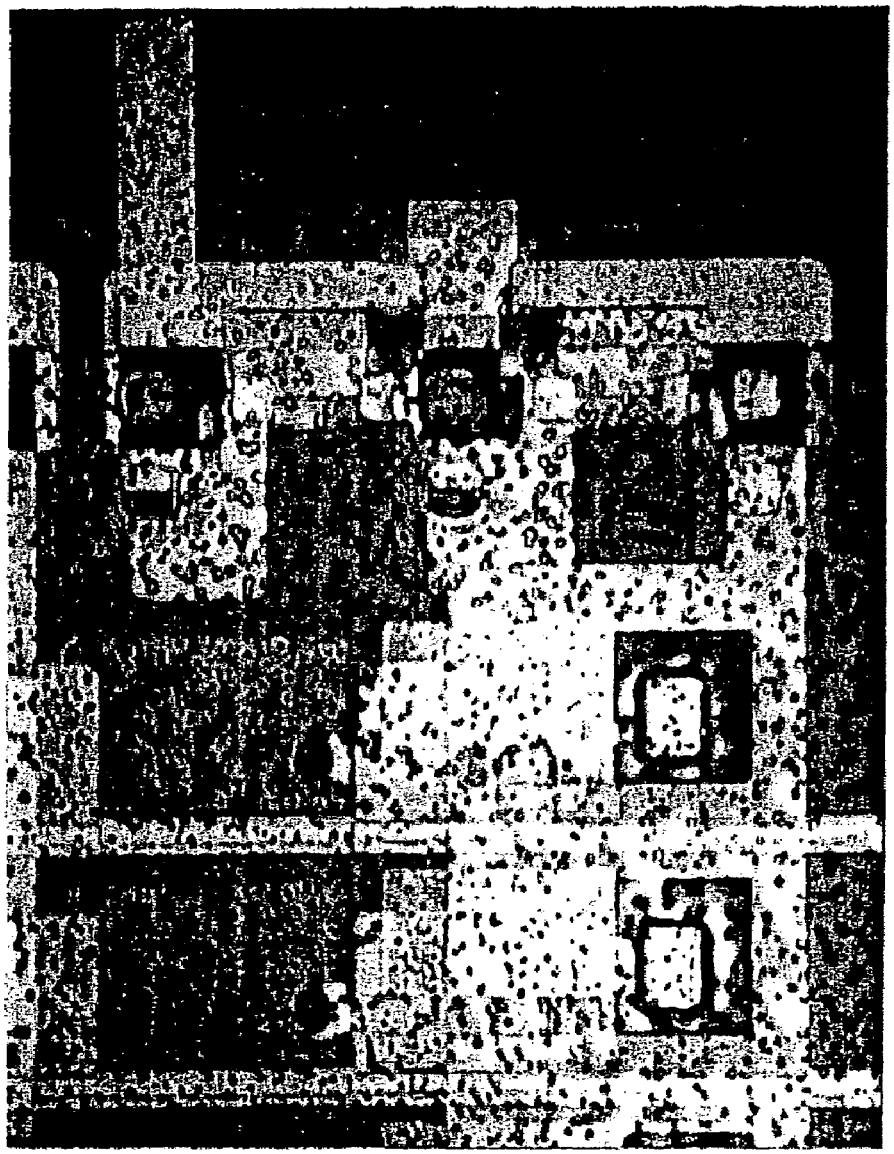
FIGS. 7A and 7B are diagrams for explaining a phenomenon occurring when an organic film is not coated and is coated over the plastic substrate in the array process of the plastic substrate according to the present invention, respectively.
Figure 7B:
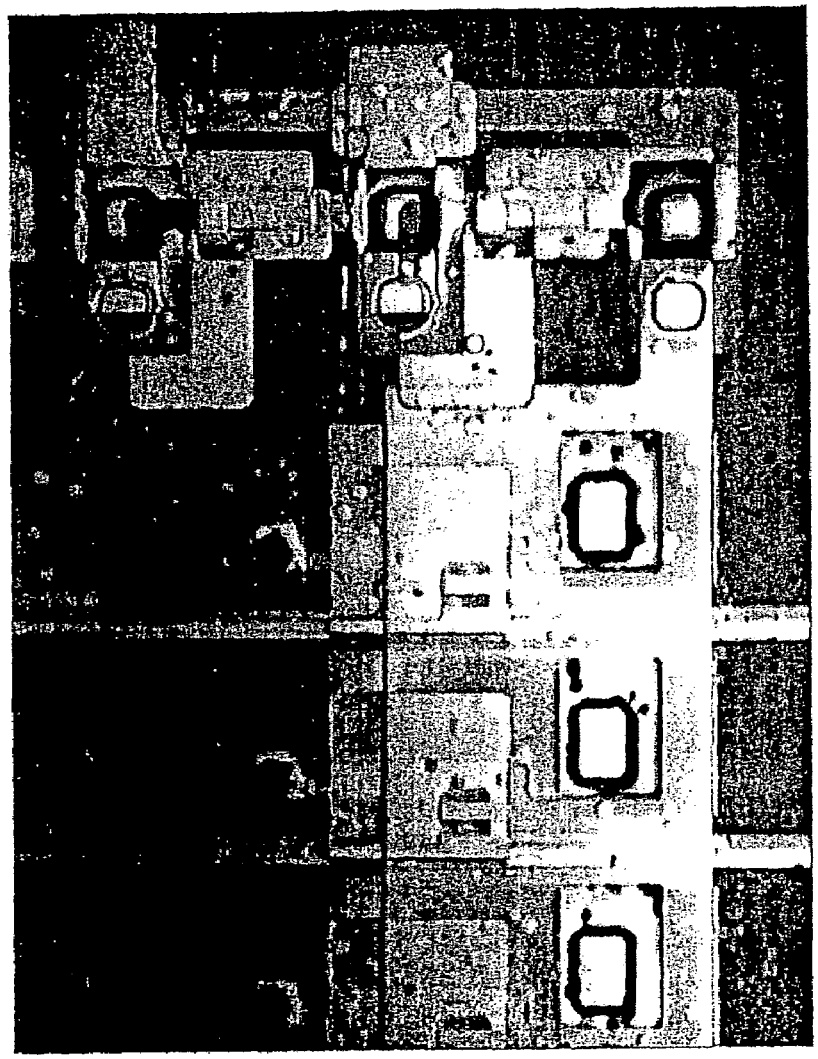

FIGS. 7A and 7B are diagrams for explaining a phenomenon generated when an organic film is not coated and is coated over the plastic substrate in the array process of the plastic substrate according to the present invention, respectively.

When forming a thin film transistor device on the plastic substrate that has been heat-treated and is not coated with the organic film, heat generated in the heat treatment process or when forming the thin film transistor device melts the plastic substrate and creates polymer bubbles. The bubbles increase the roughness of the plastic surface, thus, the plastic substrate surface is made non-uniform. As shown in FIG. 7A, it is confirmed that a thin film transistor device formed on the plastic substrate having a non-uniform surface is not correctly formed.

On the other hand, when forming a thin film transistor device on the plastic substrate that has been heat-treated and is coated with the organic film, it is confirmed that a thin film transistor device can be formed correctly, as shown in FIG. 7B, because the organic film levels the surface of the plastic substrate evenly.

Processing methods of the plastic substrate according to the foregoing embodiments of the present invention may be applied to substrates made of various materials and substrates of various flexible display devices. Examples of flexible display devices include liquid crystal display devices and substrates of organic light emitting display devices.

A fabricating method of the TFT array substrate using a flexible plastic substrate according to the present invention, as described above, includes coating the plastic substrate, such as polyethylene or naphthalate, with an organic film and heat-treating the substrate. The heat-treating levels the plastic substrate so that it is uniform and hardens the organic film. Plastic substrates made of materials such as polyethylene or naphthalate are inexpensive and easy to obtain. Accordingly, the present invention prevents each wire line of the display device from not being formed correctly due to heat generated during the array process. Thus, it is possible to improve the stability of the fabricating process of the display device.

The present invention may improve the production yield of the display device as the fabricating process of the display device is stable. The present invention increases the usefulness of inexpensive plastic materials in that they may be used as the display device substrate. Thus, it is possible to reduce the manufacturing costs of the display device which includes the flexible plastic substrate. Further, the present invention lessens the heat treatment time to shorten the manufacturing time, thus it is possible to increase the manufacturing yield of the display device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating method, comprising:
   providing a plastic substrate;
   spreading an organic film over the plastic substrate;
   applying heat to the plastic substrate over which the organic film is spread to conduct heat to the plastic substrate and to harden the organic film at the same time; and
   forming at least a wire line on the organic film after applying heat to the plastic substrate.

2. The fabricating method according to claim 1, wherein the heat applied to the plastic substrate and the organic film on the plastic substrate has a temperature range of not less than 200° C. and not more than a glass transition temperature of the plastic substrate.

3. The fabricating method according to claim 2, wherein the heat applied to the plastic substrate is applied for 20 hours or more.

4. The fabricating method according to claim 1, wherein the heat is applied to the plastic substrate so that a ratio between a change in length of an x-axis of the plastic substrate and a change in length of a y-axis is below 1.3:1.

5. The fabricating method according to claim 1, wherein the organic film is selected from the group consisting of benzocyclobutene, acrylic resin, epoxy resin, polyvinyl phenol and polyvinyl alcohol (PVA).

6. The fabricating method according to claim 1, wherein the organic film excludes a hydroxyl radical.

7. The fabricating method according to claim 1, wherein the plastic substrate is selected from the group consisting of polyethylene naphthalate, polyethylene terephthalate and polycarbonate.

8. The fabricating method according to claim 1, wherein the plastic substrate is a substrate for a thin film transistor device.

9. The fabricating method according to claim 1, further comprising dissolving an organic material in an organic solvent to form the organic film before spreading the organic film on the plastic substrate.

10. A fabricating method, comprising:
    providing a plastic substrate having heat directivity to deform in one-direction in which heat is applied;
    spreading an organic film over the plastic substrate;
    applying the heat to the plastic substrate over which the organic film is spread to conduct heat to the plastic substrate and to harden the organic film at the same time; and
    forming at least a wire line on the organic film after applying heat to the plastic substrate.

11. The fabricating method according to claim 10, wherein the heat applied to the plastic substrate and the organic film on the plastic substrate has a temperature range of not less than 200° C. and not more than a glass transition temperature of the plastic substrate.

12. The fabricating method according to claim 11, wherein the heat applied to the plastic substrate is applied for 20 hours or more.

13. The fabricating method according to claim 10, wherein the heat is applied to the plastic substrate so that a ratio between a change in length of an x-axis of the plastic substrate and a change in length of a y-axis is below 1.3:1.

14. The fabricating method according to claim 10, wherein the organic film is selected from the group consisting of benzocyclobutene, acrylic resin, epoxy resin, polyvinyl phenol and polyvinyl alcohol (PVA).

15. The fabricating method according to claim 10, wherein the organic film excludes a hydroxyl radical.

16. The fabricating method according to claim 10, wherein the plastic substrate is selected from the group consisting of polyethylene naphthalate, polyethylene terephthalate and polycarbonate.

17. The fabricating method according to claim 10, wherein the plastic substrate is a substrate for a thin film transistor device.

18. The fabricating method according to claim 10, further comprising dissolving an organic material in an organic solvent to form the organic film before spreading the organic film on the plastic substrate.

* * * * *